（12）United States Patent
Satoh et al.

(10) Patent No.: US 7,867,926 B2
(45) Date of Patent: Jan. 11, 2011

(54) SUBSTRATE PROCESSING APPARATUS AND METHOD

(75) Inventors: Naoyuki Satoh, Nirasaki (JP); Takeshi Tamura, Koshi (JP); Hiroyuki Ide, Koshi (JP); Manabu Hama, Aichi (JP)

(73) Assignee: Tokyo Electron Limited, Tokyo (JP)

( * ) Notice: Subject to any disclaimer, the term of this patent is extended or adjusted under 35 U.S.C. 154(b) by 238 days.

(21) Appl. No.: 12/155,474

(22) Filed: Jun. 4, 2008
(Under 37 CFR 1.47)

(65) Prior Publication Data
US 2009/0156019 A1　Jun. 18, 2009

(30) Foreign Application Priority Data
Jun. 29, 2007　(JP) ............... 2007-171354

(51) Int. Cl.
*H01L 21/00* (2006.01)
(52) U.S. Cl. .............. 438/798; 438/481; 117/204; 257/E21.471
(58) Field of Classification Search ........ 438/481, 438/798; 257/E21.471; 117/204
See application file for complete search history.

(56) References Cited
U.S. PATENT DOCUMENTS
2005/0079690 A1* 4/2005 Suka et al. ............ 438/481
FOREIGN PATENT DOCUMENTS
JP　62-26037　2/1987
JP　7-66162　3/1995
JP　9-153491　6/1997
JP　2004-186682　7/2004
JP　2004-282099　10/2004

OTHER PUBLICATIONS
Japanese Office Action issued Oct. 22, 2009 for Japanese Application No. 2007-171354 w/partial English language translation.

* cited by examiner

*Primary Examiner*—Jarrett J Stark
*Assistant Examiner*—John M Parker
(74) *Attorney, Agent, or Firm*—Smith, Gambrell & Russell, LLP

(57) ABSTRACT

A substrate processing apparatus is used for radiating UV rays onto a target film formed on a target surface of a substrate to perform a curing process of the target film. The apparatus includes a hot plate configured to heat the substrate to a predetermined temperature, a plurality of support pins disposed on the hot plate to support the substrate, and a UV radiating device configured to radiate UV rays onto the target surface of the substrate supported on the support pins. The support pins are preset to provide a predetermined thermal conductivity to conduct heat of the substrate to the hot plate. The hot plate is preset to have a predetermined thermal capacity sufficient to absorb heat conducted through the support pins.

20 Claims, 6 Drawing Sheets

SUBSTRATE PROCESSING APPARATUS AND METHOD

BACKGROUND OF THE INVENTION

1. Field of the Invention

The present invention relates to a substrate processing apparatus and method for performing a curing process on a target film formed on a substrate, such as a semiconductor wafer, to cure the target film.

2. Description of the Related Art

As a method for forming an inter-level insulating film on, e.g., a semiconductor wafer (which may be referred to as "wafer"), in the process of manufacturing semiconductor devices, there is an SOD (Spin on Dielectric) method that comprises steps of forming a coating film on a wafer by spin coating and performing a chemical process or heating process on the film, thereby forming an inter-level insulating film.

According to this method, at first, a coating liquid formed of a solvent with a material dispersed therein for forming an insulating film is applied on the surface of a wafer, and then the solvent of the coating liquid is dried up. Then, the coating film (target film) is heated to perform a baking process for causing a chemical reaction. Then, the coating film is heated to perform a curing process for curing the film, thereby forming a predetermined insulating film.

As a curing apparatus for curing a coating film in the process of forming an insulating film, there is an EB curing apparatus for performing a curing process by use of an electron beam (see Jpn. Pat. Appln. KOKAI Publication No. 2004-186682).

According to the EB curing apparatus, a wafer is placed inside a process chamber having a predetermined vacuum atmosphere, and an electron beam is radiated from an electron beam generation unit onto the target surface of the wafer to perform a curing process. An EB curing process is thus performed on a coating film (target film) formed on the wafer, so that the insulating film is cured.

The EB curing process entails a problem in curing an insulating film having a low specific dielectric constant (k-value) (which may be referred to as "Low-k film"), such that an electron beam radiated onto the film tends to damage the film.

In light of this, an UV curing process is commonly used for a Low-k film in place of the EB curing process. The UV curing process is arranged to radiate UV rays (ultraviolet rays) onto a coating film to perform film curing without damaging the Low-k film.

However, the UV curing process requires the illumination intensity of UV rays to be higher to increase the processing rate. Consequently, another problem may arise such that the temperature of the radiation target object becomes unnecessarily higher.

Further, in order to control the temperature increase of the radiation target object, a cooling function needs to be added, so the apparatus becomes more complex and thereby brings about an increase in cost.

BRIEF SUMMARY OF THE INVENTION

An object of the present invention is to provide a substrate processing apparatus and method for curing a target film formed on the target surface of a substrate while radiating UV rays (ultraviolet rays) onto the target film, wherein the apparatus and method can prevent an increase in cost and can stably control the temperature of the substrate.

According to a first aspect of the present invention, there is provided a substrate processing apparatus for radiating UV rays (ultraviolet rays) onto a target film formed on a target surface of a substrate to perform a curing process of the target film, the substrate processing apparatus comprising: a hot plate configured to heat the substrate to a predetermined temperature; a plurality of support pins disposed on the hot plate to support the substrate; and a UV radiating device configured to radiate UV rays onto the target surface of the substrate supported on the support pins, wherein the support pins are preset to provide a predetermined thermal conductivity to conduct heat of the substrate to the hot plate, and the hot plate is preset to have a predetermined thermal capacity sufficient to absorb heat conducted through the support pins.

According to a second aspect of the present invention, there is provided a substrate processing method for radiating UV rays (ultraviolet rays) onto a target film formed on a target surface of a substrate to perform a curing process of the target film, the substrate processing method comprising: placing the substrate on a plurality of support pins disposed on a hot plate; then, heating the substrate to a predetermined temperature by the hot plate; and then, radiating UV rays onto the target surface of the substrate supported on the support pins, thereby performing the curing process, wherein the support pins are preset to provide a predetermined thermal conductivity, and the hot plate is preset to have a predetermined thermal capacity, and wherein the curing process comprises conducting heat, applied to the substrate by the UV rays, through the support pins to the hot plate, and absorbing the heat conducted through the support pins into the hot plate, thereby preventing the substrate from being overheated.

In the first and second aspects, a heat transfer amount from the substrate to the hot plate may be preset by adjusting the material, height, and/or number of the support pins. The support pins may be arranged such that an area of the hot plate with a higher illumination intensity of UV rays from the UV radiating device is provided with a lager number of support pins. In this case, the support pins may comprise a plurality of sets of support pins concentrically disposed in decreasing order of density from a central side of the substrate.

The hot plate may be arranged to have a volume selected to preset the predetermined thermal capacity. The hot plate may be made of a material selected to preset the predetermined thermal capacity.

The apparatus may further comprise a cooling device configured to cool the hot plate to increase the thermal capacity of the hot plate. In this case, the cooling device may be disposed to face, with a gap therebetween, a surface of the hot plate opposite to a surface provided with the support pins. The cooling device may comprise a base plate structurally connected to the hot plate through struts and provided with a cooler built therein. In this case, the apparatus may further comprise a control section preset to concurrently set the UV radiating device, the cooler, and the heater in an on-state in the curing process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
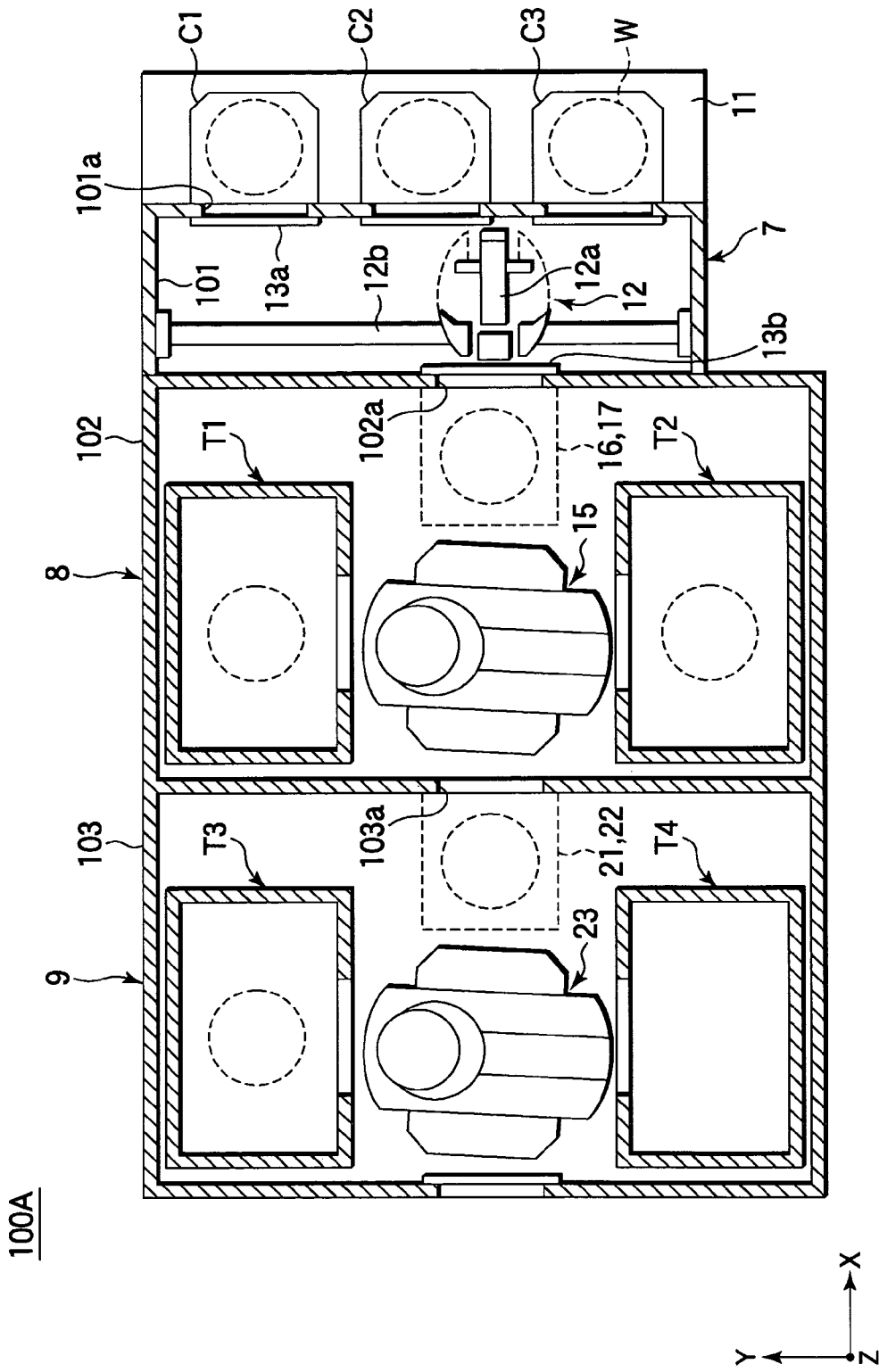
FIG. 1 is a plan view schematically showing the structure of an SOD system including a UV curing block which is a substrate processing apparatus according to an embodiment of the present invention.
Figure 2:
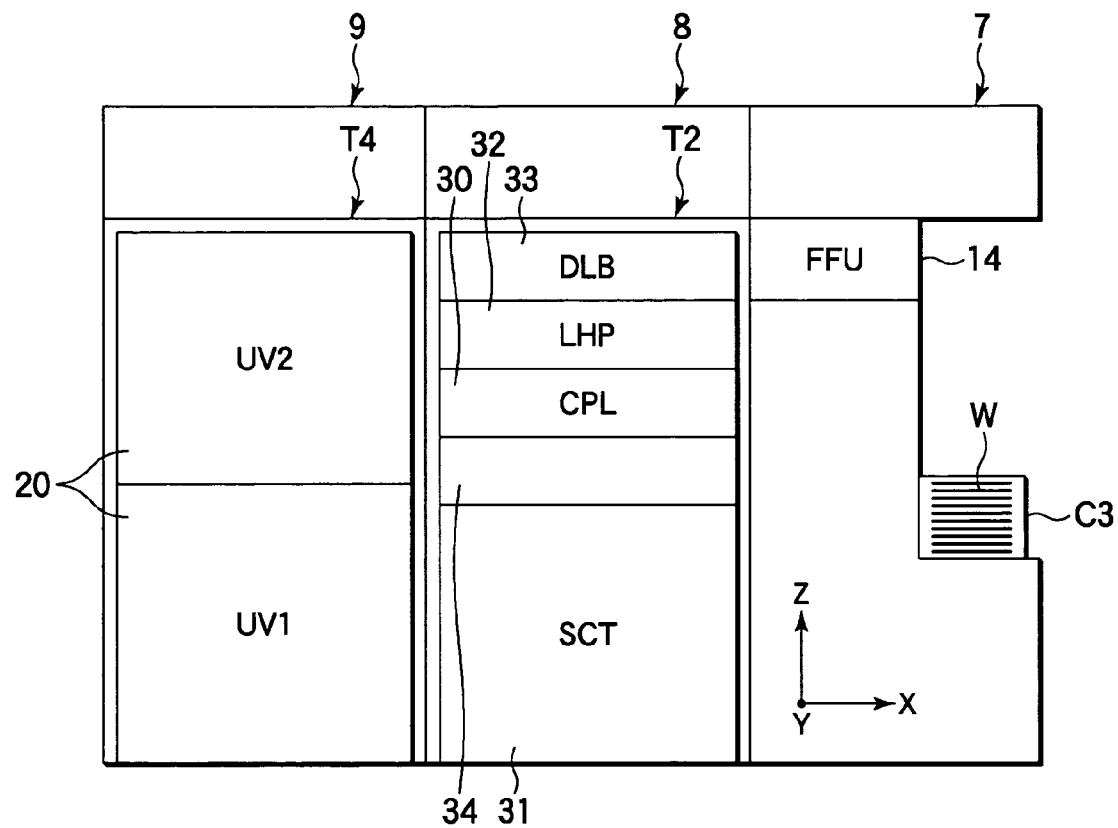
FIG. 2 is a side view of the SOD system shown in FIG. 1.

Embodiments of the present invention will now be described with reference to the accompanying drawings. FIG. 1 is a plan view schematically showing the structure of an SOD system including a UV curing block which is a substrate processing apparatus according to an embodiment of the present invention. FIG. 2 is a side view of the SOD system shown in FIG. 1.

The SOD system 100A includes process blocks 8 and 9 for performing predetermined processes on wafers W. The SOD system 100A further includes a carrier block 7 for transferring carriers C1 to C3, each storing a predetermined number of wafers W, therethrough relative to the outside, and for transferring wafers W between the carriers C1 to C3 and process block 8.

The carrier block 7 includes a carrier table 11, on which, for example, three carriers C1 to C3 can be placed in a row in a Y-direction. The carrier block 7 is provided with a transfer device 12 disposed in the casing 101 to transfer wafers W between the carriers C1 to C3 placed on the carrier table 11 and the process block 8.

For example, each of the carriers C1 to C3 can store 25 wafers W essentially in a horizontal state at regular intervals in the vertical direction (Z-direction). The casing 101 has wafer transfer ports 101a formed in the wall adjacent to the carrier table 11. Each of the ports 101a is provided with a shutter 13a for opening/closing the port.

The transfer device 12 includes a transfer pick 12a for picking up a wafer W from the carriers C1 to C3 and transferring it to the process block 8, and for picking up a wafer W from the process block 8 and transferring it to the carriers C1 to C3. For this purpose, the transfer pick 12a is movable back and forth in the X-direction and Y-direction, rotatable in the X-Y plane (horizontal plane), movable up and down in the Z-direction, and slidable in the Y-direction along a guide rail 12b.

The process block 8 includes process towers T1 and T2, a transit unit (TRS) 16, a UV irradiation unit (DVT) 17, and a substrate transfer device 15 disposed in a casing 102. The process towers T1 and T2 are structured to perform predetermined processes on wafers W for forming an insulating film. The transit unit (TRS) 16 is used for transferring wafers W between the carrier block 7 and process block 8. The UV irradiation unit (DVT) 17 is disposed above the transit unit (TRS) 16 and configured to perform a UV irradiation process on the surface of a wafer W. The substrate transfer device 15 is used for transferring wafers W inside the process block 8.

The casing 102 has a wafer transfer port 102a formed in the wall adjacent to the carrier block 7 at a position corresponding to the transit unit (TRS) 16. The port 102a is provided with a shutter 13b for opening/closing the port.

Further, a fan/filter unit (FFU) 14 is disposed at the top of the casing 101, and clean air is supplied therefrom as a down flow into the casing 101. Consequently, particles are prevented from being deposited on wafers W.

The process block 9 includes process towers T3 and T4, a transit unit (TRS) 21, a UV irradiation unit (DVT) 22, and a substrate transfer device 23 disposed in a casing 103. The process tower T3 is structured to perform predetermined processes on wafers W for forming an insulating film. The process tower T4 includes two UV curing blocks (UV) 20 (substrate processing apparatuses according to an embodiment of the present invention) stacked one on the other as shown in FIG. 2, each configured to perform a UV curing process on a wafer W with an insulating film formed thereon by any one of the process towers T1 to T3. The transit unit (TRS) 21 is used for transferring wafers W between the carrier block 7 and process block 9 through the process block 8. The UV irradiation unit (DVT) 22 is disposed above the transit unit (TRS) 21 and configured to perform a UV irradiation process on the surface of a wafer W. The substrate transfer device 23 is used for transferring wafers W inside the process block 9.

The casing 103 has a wafer transfer port 103a formed in the wall adjacent to the process block 8 at a position corresponding to the transit unit (TRS) 21.

Further, a fan/filter unit (FFU) (not shown) is disposed at the top of the casing 103, and clean air is supplied therefrom as a down flow into the casing 103.

Each of the process towers T1 to T3 includes a plurality of processing units stacked one on the other in the vertical direction for performing a series of processes for forming an insulating film on a wafer W by an SOD method In this embodiment, the series of processes performed in the process towers T1 to T3 are processes for handling a chemical liquid and drainage of the chemical liquid and for handling exhaust gas containing components vaporized or volatilized from a coating film formed on a wafer W. Specifically, each of the process towers T1 to T3 includes a temperature adjusting unit (CPL) 30, a coating unit (SCT) 31, a low-temperature heating unit (LHP) 32, and a baking unit (DLB) 33. The temperature adjusting unit (CPL) 30 is used for adjusting the temperature of a wafer to a predetermined temperature before a chemical liquid containing a material for forming an insulating film is applied onto the wafer. The coating unit (SCT) 31 is configured to perform a process for applying the chemical liquid onto the wafer surface to form a coating film. The low-temperature heating unit (LHP) 32 is used for heating the coating film formed on the wafer surface to vaporize the solvent contained in the coating film, thereby drying the coating film. The baking unit (DLB) 33 is used for heating the wafer W to perform a process for promoting a chemical reaction of the coating film. Further, this is not necessarily required, but each of the process towers T1 to T3 may include a film thickness measuring unit 34 for measuring the thickness of the insulating film.

According to the SOD system 100A, a plurality of processing units for performing a series of processes are concentrated in each of the process towers T1 to T3, so the foot print of the process blocks 8 and 9 is minimized. Consequently, a smaller clean room can be used for installation of the SOD system 100A, and a smaller fan/filter unit (FFU) can be used at the top of the process blocks 8 and 9, thereby easing the burden of cost.

Further, each of the process towers T1 to T3 is arranged such that the temperature adjusting unit (CPL) 30, low-temperature heating unit (LHP) 32, and baking unit (DLB) 33 are stacked above the film thickness measuring unit 34 in this order from below to define a heating process area for performing predetermined heating processes on a wafer W. Further, the coating unit (SCT) 31 for forming a coating film on the wafer W is disposed below the film thickness measuring unit 34 to define a coating process area.

As described above, each of the process towers T1 to T3 is arranged to form a structure such that the film thickness measuring unit 34 decreases heat diffusion from the heating process area to the coating process area. Consequently, in the coating unit (SCT) 31, the quality of the coating film is prevented from fluctuating due to a temperature change, so the coating film can be provided with constant quality. The space above the baking unit (DLB) 33 is utilized as a space for placing units associated with power usage, such as motor and power transmission lines, and an exhaust area for placing exhaust pipes and so forth.

According to the SOD system 100A having the structure described above, for example, carriers C1 to C3 each storing 25 wafers W are first transferred onto the carrier table 11 of the carrier block 7 from the outside by an automatic transfer robot (or operator). Then, a wafer W is picked up by the transfer device 12 from, e.g., the carrier C1 and is transferred onto the transit unit (TRS) 16 of the process block 8. Then, the wafer W is transferred by the substrate transfer device 15 from the transit unit (TRS) 16 to the temperature adjusting unit (CPL) 30 of, e.g., the process tower T1, in which the wafer W is adjusted to a predetermined temperature (for example 23° C.). The wafer W thus adjusted in temperature is transferred by the substrate transfer device 15 from the temperature adjusting unit (CPL) 30 to the coating unit (SCT) 31, in which a chemical liquid is applied onto the wafer W to form a coating film (target film).

Where the wafer W is the first wafer taken out from the carrier C1, the wafer W with the coating film formed thereon by the coating unit (SCT) 31 is transferred by the substrate transfer device 15 to the film thickness measuring unit 34, in which the thickness of the coating film is measured. The measurement data of the film thickness is output from the unit controller (not shown) of the film thickness measuring unit 34 to the tower controller (not shown). If the film thickness data is within a standard range determined in advance, the tower controller (not shown) allows the predetermined processes in the process tower T1 to be continued without changing the control parameters of the coating unit (SCT) 31.

On the other hand, if the film thickness data is out of the standard range but is within a correctable range, the tower controller (not shown) corrects a predetermined process parameter (such as the rotation number of a spin chuck) of the coating unit (SCT) 31, and outputs the corrected value to the unit controller (not shown) of the coating unit (SCT) 31. Thereafter, the process for forming the coating film is performed by the coating unit (SCT) 31 in accordance with the process parameters including the corrected value. However, if the film thickness data is out of the standard range and is out of the correctable range, the tower controller (not shown) sends out a warning to the operator of the SOD system 100A by use of sounding of a buzzer, lighting of an alarm lamp, and/or displaying of an alarm sign on an operational screen.

The wafer W with the coating film formed thereon is transferred by the substrate transfer device 15 to the low-temperature heating unit (LHP) 32, in which the wafer W is heated to about 100° C. to 130° C. to dry the coating film. Then, the wafer W is transferred by the substrate transfer device 15 to the baking unit (DLB) 33, in which the wafer W is heated to, e.g., about 200° C. to 300° C. to perform a predetermined baking process, so as to form an insulating film. For example, the baking process temperature is set at about 200° C. for a chemical liquid available by the name of "LKD", at about 300° C. for a chemical liquid available by the name of "Silk", at about 240° C. for a chemical liquid available by the name of "AlCap", and at about 200° C. for a chemical liquid available by the name of "DUO".

Where the wafer W is the first wafer taken out from the carrier C1, the wafer W processed by the baking process in the baking unit (DLB) 33 is transferred by the substrate transfer device 15 to the film thickness measuring unit 34, in which the thickness of the insulating film formed by the baking process is measured. The measurement data of the film thickness is sent to the tower controller (not shown). If the film thickness data is within a standard range determined in advance, the tower controller (not shown) allows the processes in the process tower T1 to be continued for the second wafer W and thereafter. On the other hand, if the film thickness data is out of the standard range but is within a correctable range, a process parameter, such as the heating temperature, heating time, or $N_2$ concentration used in the baking unit (DLB) 33, is corrected. Then, the process in the baking unit (DLB) 33 is performed in accordance with the process parameters including the corrected value, for the second wafer W and thereafter. However, if the film thickness data is out of the standard range and is out of the correctable range, a predetermined alarm is displayed and the processes in the process tower T1 are stopped.

The wafer W processed by the baking process is sequentially transferred by the substrate transfer device 15 onto the transit unit (TRS) 21 of the process block 9. Then, the wafer W is transferred by the substrate transfer device 23 to one of the two UV curing blocks (UV) 20 staked one on the other in the process tower T4, in which the wafer W is subjected to a predetermined curing process. The structure of each UV curing block (UV) 20 will be explained later in detail, because it relates to a feature of the present invention.

After the curing process in the UV curing block (UV) 20 is finished, the wafer W is transferred by the substrate transfer device 23 onto the transit unit (TRS) 21. Then, the wafer W is transferred by the substrate transfer device 15 of the process block 8 onto the transit unit (TRS) 16. Then, the wafer W is transferred by the transfer device 12 back into the carrier C1.

Figure 3:
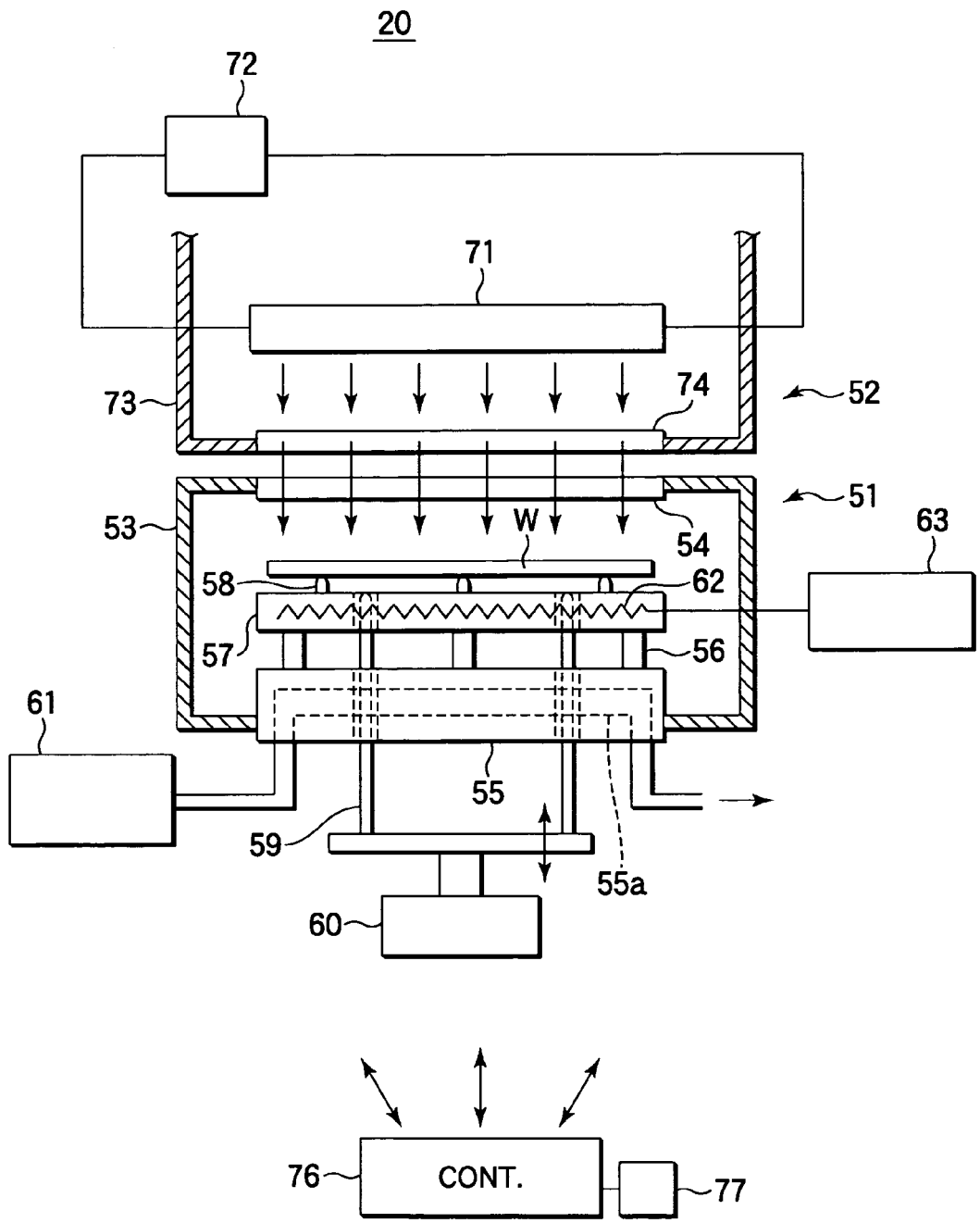
FIG. 3 is a sectional view schematically showing the structure of the UV curing block (UV) disposed in the SOD system shown in FIG. 1.

Next, with reference to FIG. 3, an explanation will be given of the UV curing block (UV) 20, which is a substrate processing apparatus according to an embodiment of the present invention. FIG. 3 is a sectional view schematically showing the structure of the UV curing block (UV) 20.

As shown in FIG. 3, the UV curing block (UV) 20 includes a curing process unit 51 and a UV irradiation unit 52. The curing process unit 51 comprises a chamber 53 for accommodating a target substrate or semiconductor wafer W. The UV irradiation unit 52 is configured to radiate UV rays (ultraviolet rays) onto the wafer W placed inside the curing process unit 51.

The curing process unit 51 includes the chamber 53 and a light-receiving window 54 disposed at the ceiling of the chamber 53 to transmit UV rays into the chamber from above. The light-receiving window 54 is made of, e.g., quartz glass.

Further, a base plate 55 is disposed as a base for supporting the wafer W inside the chamber. A hot plate 57 for heating the wafer W is disposed above and connected to the base plate 55 through a plurality of struts 56. The hot plate 57 is provided with a plurality of proximity pins 58 (support pins) for supporting the wafer W.

The proximity pins 58 disposed on the hot plate 57 serve to efficiently conduct heat of the wafer W to the hot plate 57 so that the wafer W is prevented from being overheated. For this purpose, the thermal conductivity provided by the proximity pins 58 on the hot plate 57 is preset to be high with a predetermined value (for example, 100 W/(m·k)) or more.

In order to realize such a thermal conductivity, the proximity pins 58 are preferably made of a material having a high hardness and a high heat resistance as well as a high thermal conductivity, such as silicon carbide (SiC).

Further, in order to increase the heat transfer amount from the wafer W to the hot plate 57, not only the material of the proximity pins 58 is suitably selected, but also the number of proximity pins 58 is preferably preset to be lager.

Figure 4:
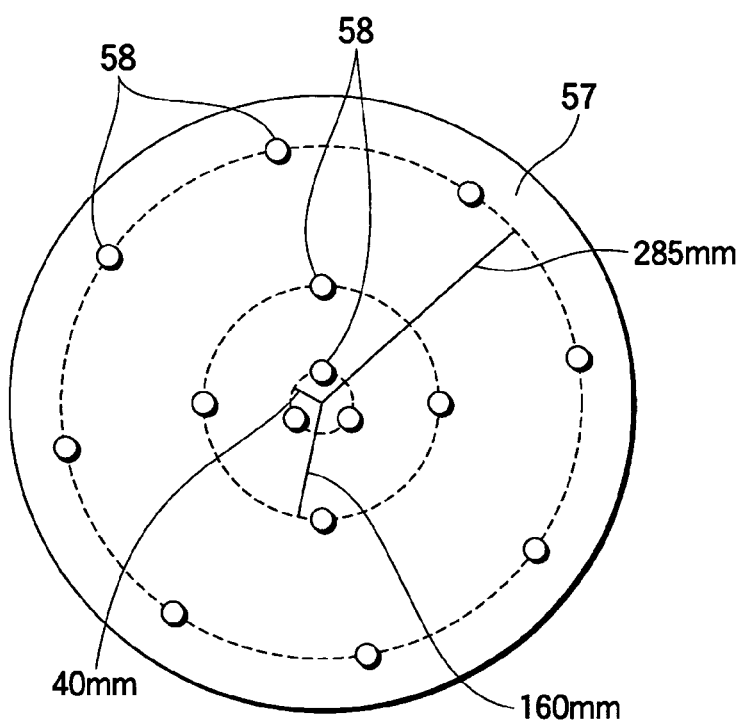
FIG. 4 is a plan view showing a hot plate used in the UV curing block (UV) shown in FIG. 3, for explaining the positions of proximity pins.

For example, as shown in the plan view of FIG. 4, on the upper surface of the hot plate 57, three pins 58 are equidistantly arrayed on a circle having a radius of 40 mm about the center of the wafer, four pins 58 are equidistantly arrayed on a circle having a radius of 160 mm about the center of the wafer, and eight pins 58 are equidistantly arrayed on a circle having a radius of 285 mm about the center of the wafer.

Where a number of proximity pins 58 are disposed, the area of the hot plate 57 with a higher illumination intensity of UV rays is provided with a lager number of pins. Consequently, heat of the wafer W supported on the pins 58 is efficiently released through the pins 58 to the hot plate 57, and the wafer W is thereby prevented from being overheated.

Further, the height of the proximity pins 58 may be adjusted to set the heat transfer amount from the wafer W to the hot plate 57.

The hot plate 57 is provided with a heater 62 embedded therein. The heater 62 is supplied with an electric current from a heater drive unit 63 so that the heater 62 generates heat by resistance heating as a whole to maintain the hot plate 57 at a predetermined temperature.

The hot plate 57 has a predetermined thermal capacity (for example 1,300 J/K) sufficient to absorb heat of the wafer W conducted through the proximity pins 58 supporting the wafer W.

In order to have the necessary thermal capacity, the material of the hot plate 57 is preferably silicon carbide (SiC) or aluminum nitride. Further, the volume of the hot plate 57 is preferably adjusted to set a sufficient thermal capacity.

The base plate 55 serves as a cooling device for increasing the thermal capacity of the hot plate 57. Specifically, the base plate 55 has a flow passage 55a of cooling water formed therein. The cooling water is supplied from a cooling water supply unit 61 into the flow passage 55a during a curing process so that the base plate 55 is cooled to a predetermined temperature as a whole.

Further, the struts 56 connecting the base plate 55 to the hot plate 57 have an exposed surface of large area to improve the heat release effect. The struts 56 are made of a thermally conductive material, such as aluminum.

Further, the curing process unit 51 includes lifter pins 59 movable up and down through the base plate 55 and hot plate 57 to move up and down the wafer W placed thereon in loading/unloading the wafer W. The lifter pins 59 are moved up and down by an elevating mechanism 60 serving as a drive unit.

On the other hand, the UV irradiation unit 52(UV radiating device) disposed above the curing process unit 51 includes a UV lamp 71 that radiates UV rays (ultraviolet rays) and a power supply section 72 for applying a voltage to the UV lamp 71.

The UV lamp 71 is disposed in the casing 73, which has a radiation window 74 at the bottom so that UV rays emitted from the UV lamp 71 are transmitted into the curing process unit 51 for irradiation. For example, the radiation window 74 is made of quartz glass. UV rays emitted from the UV lamp 71 are transmitted through the radiation window 74 toward the curing process unit 51, and then UV rays are transmitted through the light-receiving window 54, and radiated onto the wafer W inside the curing process unit 51. In this case, even if the illumination intensity of UV rays is set high to improve the processing rate, the wafer W is prevented from being overheated due to heat generation of the UV lamp 71.

The operation of the UV curing block (UV) 20 is controlled as a whole by a control section 76, such as a computer. Computer programs for executing operations of the UV curing block (UV) 20 are stored in a storage section 77 comprising a storage medium, such as hard disk and/or flash memory. Specifically, in accordance with instructions from the control section 76, the elevating mechanism 60, cooling water supply unit 61, heater drive unit 63, and UV lamp 71 are controlled, as described later.

In the UV curing block (UV) 20 having the structure described above, an electric current is supplied from the heater drive unit 63 to cause the heater 62 to generate heat, and the hot plate 57 is thereby heated to a predetermined temperature (for example, 300° C.) (Step S1 in FIG. 5).

Then, the lifter pins 59 are moved up by the elevating mechanism 60 and project from the hot plate 57. Further, a wafer W is transferred through a transfer port (not shown), and is placed on the lifter pins 59. Then, the lifter pins 59 are moved down by the elevating mechanism 60 until the distal ends of the lifter pins 59 retreat to a position below the proximity pins 58, so that the wafer W is supported by the proximity pins 58 (Step S2 in FIG. 5).

Figure 5:
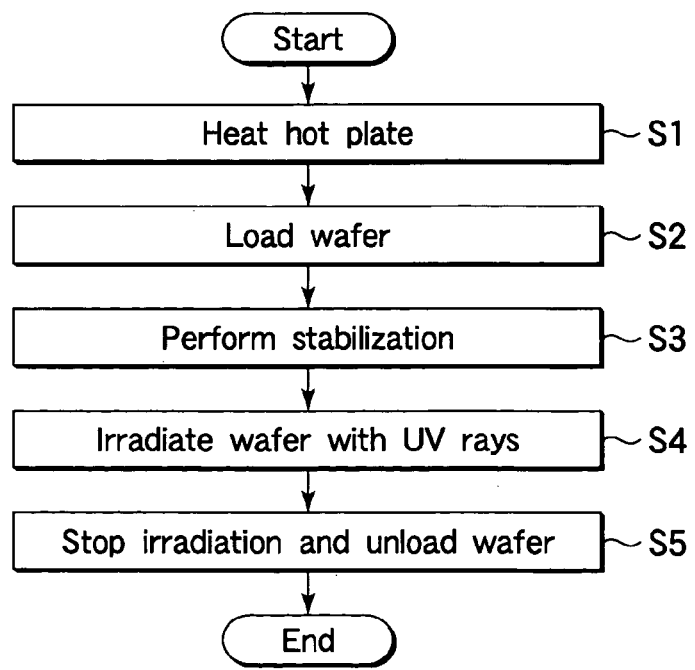
FIG. 5 is a flow chart showing the steps of an operation of the UV curing block (UV)

In this state, the wafer W is heated by the hot plate 57 and is retained until the wafer temperature is stabilized at a predetermined temperature (Step S3 in FIG. 5).

After the wafer temperature is stabilized at a predetermined temperature, a voltage is applied from the power supply section 72 to the UV lamp 71 so that UV rays (ultraviolet rays) are emitted from the UV lamp 71. The UV rays are radiated through the light-receiving window 54 of the curing process unit 51 onto the surface (target surface) of the wafer W, and this state is maintained for a predetermined time (Step S4 in FIG. 5).

When the wafer W is irradiated with the UV rays, the temperature of the wafer W can be increased. However, at this time, heat of the wafer W is conducted through a number of proximity pins 58, so the wafer W is maintained at a predetermined temperature. The heat conducted through the proximity pins 58 is absorbed by the hot plate 57.

Specifically, during the curing process performed by use of UV rays radiated from the UV lamp 71, not only the heater 62 is set in an on-state by the heater drive unit 63, but also cooling water is supplied into the flow passage 55a of the base plate 55 by the cooling water supply unit 61. In other words, during the curing process, the cooling water supply unit 61, heater drive unit 63, and UV lamp 71 are concurrently set in an on-state under the control of the control section 76. Consequently, the wafer W is reliably prevented from being overheated.

After the wafer W is irradiated with the UV rays for a predetermined time, UV radiation is stopped to finish the curing process, and the wafer W is unloaded from the chamber 53 (Step S5 in FIG. 5).

As described above, in the substrate processing method according to an embodiment of the present invention, the proximity pins 58 for supporting a semiconductor wafer W are designed to provide a high thermal conductivity with a predetermined value (for example, 100 W/(m·k)) or more, so that heat of the wafer W is efficiently conducted to the hot plate 57. Further, the hot plate 57 is designed to have a predetermined thermal capacity sufficient to absorb the heat conducted through the proximity pins 58.

With this arrangement, when the temperature of the wafer tends to be unnecessarily increased by irradiation with the UV rays, heat of the wafer W is efficiently conducted through the proximity pins 58 to the hot plate 57. Consequently, the temperature of the wafer W is reliably prevented from being excessively increased.

Further, this effect is obtained by adjusting the thermal conductivity of the proximity pins 58 and the thermal capacity of the hot plate 57. Accordingly, there is no need to add a complex cooling mechanism, thereby preventing an increase in cost.

In the embodiment described above, the UV curing blocks (UV) 20 each serving as a substrate processing apparatus are disposed in the layout of the SOD system 100A shown in FIGS. 1 and 2, but this is not limiting.

Figure 6:
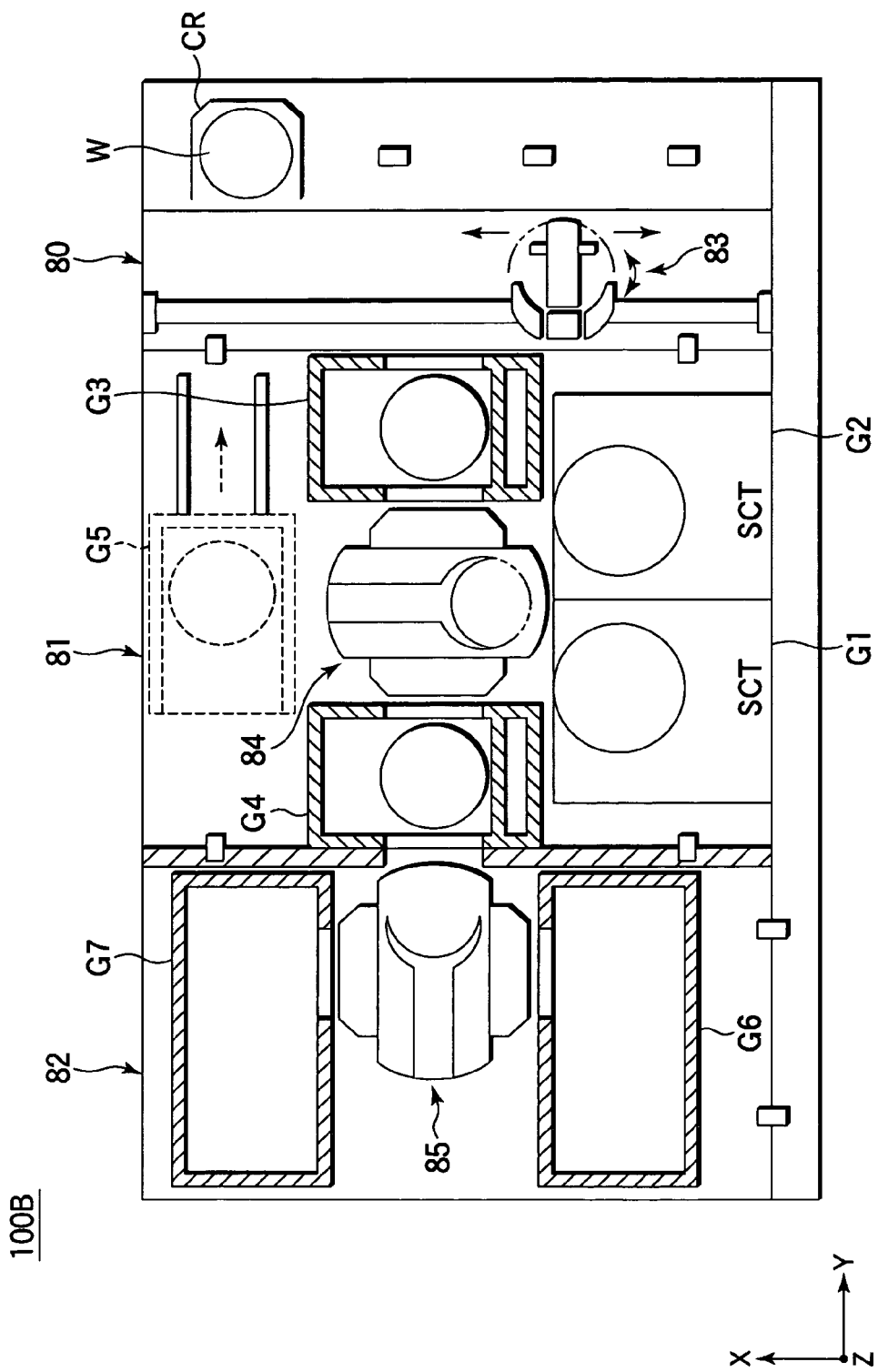
FIG. 6 is a plan view schematically showing the layout of an SOD system including a UV curing block which is a substrate processing apparatus according to another embodiment of the present invention.
Figure 7:
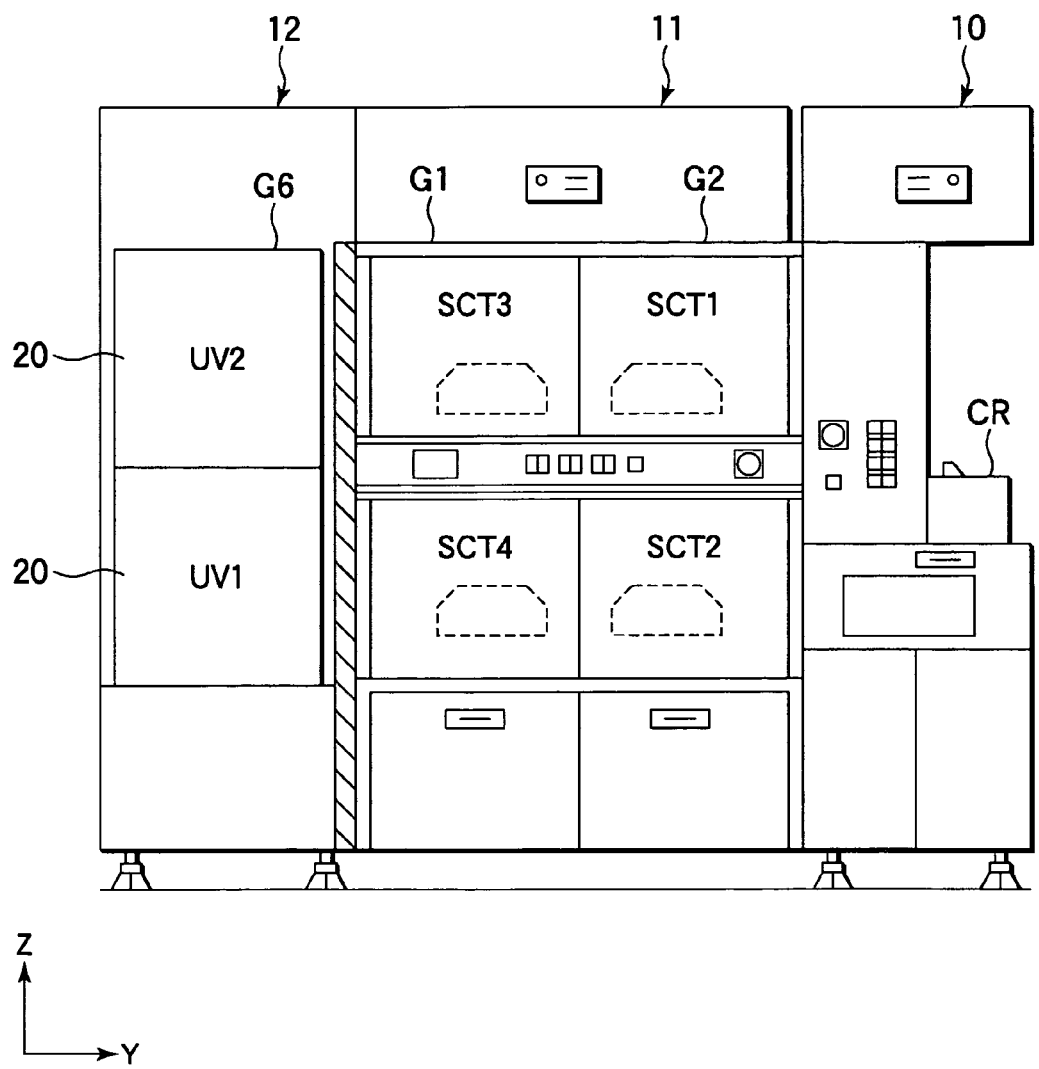
FIG. 7 is a side view of the SOD system shown in FIG. 6.

For example, a UV curing block (UV) 20 according to the embodiment described above may be disposed in the layout of an SOD system 100B, as show in the plan view of FIG. 6 and the side view of FIG. 7.

In this case, for example, as shown in FIGS. 6 and 7, the SOD system 100B includes a cassette block 80, a first process block 81, and a second process block 82 integratedly connected to each other. The cassette block 80 is used for transferring wafers W to and from wafer cassettes CR. The first process block 81 includes a number of various processing units of the single-substrate type disposed at predetermined positions and configured to perform predetermined processes on wafers W one by one in SOD coating steps. The second process block 82 also includes a number of various processing units of the single-substrate type disposed at predetermined positions, for performing predetermined processes on wafers W.

The cassette block 80 includes a wafer transfer member 83 for transferring wafers W between the wafer cassettes CR and first process block 81.

The first process block 81 includes a main transfer member 84 of the vertical transfer type disposed at the center, and processing units stacked one on the other around the main transfer member 84. In this embodiment, there are five unit groups G1, G2, G3, G4, and G5 including processing units stacked one on the other. Of them, the unit groups G1 and G2 include SOD coating process units (SCT) and so forth, for example. The unit group G3, G4, and G5 include thermally processing units for performing a heating process or cooling process, ad so forth, for example.

On the other hand, the second process block 82 includes a main transfer member 85, and processing units stacked one on the other on the both sides of the main transfer member 85. In this embodiment, there are two unit groups G6 and G7 including processing units stacked one on the other.

As shown in the side view of FIG. 7 of this embodiment, a plurality of (two in this case) UV curing blocks (UV) 20, each serving as a substrate processing apparatus according to an embodiment of the present invention, are stacked one on the other in the unit group G6. Alternatively, a plurality of UV curing blocks (UV) 20 may be stacked one on the other in the unit group G7.

The present invention can be applied to a substrate processing apparatus and method for performing a curing process on a target film formed on a substrate, such as a semiconductor wafer, to cure the target film. The present invention is preferably utilized in the semiconductor manufacturing industry, electronic device manufacturing industry, and so forth.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing apparatus for radiating UV rays (ultraviolet rays) onto a target film formed on a target surface of a substrate to perform a curing process of the target film, the substrate processing apparatus comprising:
    a hot plate configured to heat the substrate to a predetermined temperature;
    a plurality of support pins disposed on the hot plate to support the substrate; and
    a UV radiating device configured to radiate UV rays onto the target surface of the substrate supported on the support pins, wherein
    the support pins are preset to provide a predetermined thermal conductivity to conduct heat of the substrate to the hot plate,
    the hot plate is preset to have a predetermined thermal capacity sufficient to absorb heat conducted through the support pins, and
    the support pins are arranged such that an area of the hot plate with a higher illumination intensity of UV rays from the UV radiating device is provided with a lager number of support pins.

2. The substrate processing apparatus according to claim 1, wherein a heat transfer amount from the substrate to the hot plate is preset by adjusting the material, height, and/or number of the support pins.

3. The substrate processing apparatus according to claim 1, wherein the hot plate is arranged to have a volume selected to preset the predetermined thermal capacity.

4. The substrate processing apparatus according to claim 1, wherein the hot plate is made of a material selected to preset the predetermined thermal capacity.

5. The substrate processing apparatus according to claim 1, wherein the apparatus further comprises a cooling device configured to cool the hot plate to increase the thermal capacity of the hot plate.

6. The substrate processing apparatus according to claim 5, wherein the cooling device is disposed to face, with a gap therebetween, a surface of the hot plate opposite to a surface provided with the support pins.

7. The substrate processing apparatus according to claim 6, wherein the cooling device comprises a base plate structurally connected to the hot plate through struts and provided with a cooler built therein.

8. The substrate processing apparatus according to claim 1 wherein the support pins comprise a plurality of sets of support pins concentrically disposed in decreasing order of density from a central side of the substrate.

9. A substrate processing apparatus for radiating UV rays (ultraviolet rays) onto a target film formed on a target surface of a substrate to perform a curing process of the target film, the substrate processing apparatus comprising:

a hot plate that heats the substrate to a predetermined temperature;

a plurality of support pins disposed on the hot plate to support the substrate;

a UV radiating device that radiates UV rays onto the target surface of the substrate supported on the support pins; and a cooling device that cools the hot plate to increase the thermal capacity of the hot plate, the cooling device comprising a base plate structurally connected to the hot plate through struts and provided with a cooler built therein, wherein the support pins are preset to provide a predetermined thermal conductivity to conduct heat of the substrate to the hot plate, the hot plate is preset to have a predetermined thermal capacity sufficient to absorb heat conducted through the support pins, and the cooling device is disposed to face, with a gap therebetween, a surface of the hot plate opposite to a surface provided with the support pins.

10. The substrate processing apparatus according to claim 9, wherein the apparatus further comprises a control section preset to concurrently set the UV radiating device, the cooler, and the heater in an on-state in the curing process.

11. A substrate processing method for radiating UV rays (ultraviolet rays) onto a target film formed on a target surface of a substrate to perform a curing process of the target film, the substrate processing method comprising:

placing the substrate on a plurality of support pins disposed on a hot plate;

then, heating the substrate to a predetermined temperature by the hot plate; and then, radiating UV rays onto the target surface of the substrate supported on the support pins, thereby performing the curing process, wherein the support pins are arranged such that an area of the hot plate with a higher illumination intensity of UV rays from the UV radiating device is provided with a larger number of support pins, the support pins are preset to provide a predetermined thermal conductivity, and the hot plate is preset to have a predetermined thermal capacity, and the curing process comprises conducting heat, applied to the substrate by the UV rays, through the support pins to the hot plate, and absorbing the heat conducted through the support pins into the hot plate, thereby preventing the substrate from being overheated.

12. The substrate processing method according to claim 11, wherein the method further comprises presetting a heat transfer amount from the substrate to the hot plate by adjusting the material, height, and/or number of the support pins.

13. The substrate processing method according to claim 11, wherein the method further comprises presetting the predetermined thermal capacity by adjusting the volume of the hot plate.

14. The substrate processing method according to claim 11, wherein the method further comprises presetting the predetermined thermal capacity by adjusting the material of the hot plate.

15. The substrate processing method according to claim 11, wherein the method further comprises cooling the hot plate by a cooling device to increase the thermal capacity of the hot plate.

16. The substrate processing method according to claim 15, wherein the cooling device is disposed to face, with a gap therebetween, a surface of the hot plate opposite to a surface provided with the support pins.

17. The substrate processing apparatus according to claim 16, wherein the cooling device comprises a base plate structurally connected to the hot plate through struts and provided with a cooler built therein.

18. The substrate processing method according to claim 11, wherein the support pins comprise a plurality of sets of support pins concentrically disposed in decreasing order of density from a central side of the substrate.

19. A substrate processing method for radiating UV rays (ultraviolet rays) onto a target film formed on a target surface of a substrate to perform a curing process of the target film, the substrate processing method comprising:

placing the substrate on a plurality of support pins disposed on a hot plate;

then, heating the substrate to a predetermined temperature by the hot plate;

then, radiating UV rays onto the target surface of the substrate supported on the support pins, thereby performing the curing process; and cooling the hot plate by a cooling device to increase the thermal capacity of the hot plate, wherein the curing process comprises conducting heat, applied to the substrate by the UV rays, through the support pins to the hot plate, and absorbing the heat conducted through the support pins into the hot plate, thereby preventing the substrate from being overheated, the support pins are preset to provide a predetermined thermal conductivity, and the hot plate is preset to have a predetermined thermal capacity, the cooling device is disposed to face, with a gap therebetween, a surface of the hot plate opposite to a surface provided with the support pins, and the cooling device comprises a base plate structurally connected to the hot plate through struts and is provided with a cooler built therein.

20. The substrate processing method according to claim 19, wherein the method further comprises concurrently setting the UV radiating device, the cooler, and the heater in an on-state in the curing process.

* * * * *